(12) United States Patent
Lai et al.

(10) Patent No.: US 10,991,430 B2
(45) Date of Patent: Apr. 27, 2021

(54) NON-VOLATILE MEMORY CELL COMPLIANT TO A NEAR MEMORY COMPUTATION SYSTEM

(71) Applicant: eMemory Technology Inc., Hsin-Chu (TW)

(72) Inventors: Tsung-Mu Lai, Hsinchu County (TW); Chih-Hsin Chen, Hsinchu County (TW); Chun-Fu Lin, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 16/669,480

(22) Filed: Oct. 30, 2019

(65) Prior Publication Data

US 2020/0202941 A1    Jun. 25, 2020

Related U.S. Application Data (60) Provisional application No. 62/781,605, filed on Dec. 19, 2018, provisional application No. 62/872,715, filed on Jul. 11, 2019.

(51) Int. Cl.
| | |
|---|---|
| *G11C 16/10* | (2006.01) |
| *G11C 16/04* | (2006.01) |
| *G11C 16/26* | (2006.01) |
| *G06F 3/06* | (2006.01) |
| *G11C 16/14* | (2006.01) |

(52) U.S. Cl.
CPC ............ *G11C 16/10* (2013.01); *G06F 3/0604* (2013.01); *G06F 3/0629* (2013.01); *G06F 3/0683* (2013.01); *G11C 16/0425* (2013.01); *G11C 16/0433* (2013.01); *G11C 16/14* (2013.01); *G11C 16/26* (2013.01)

(58) Field of Classification Search
CPC . G11C 16/10; G11C 16/0425; G11C 16/0433; G11C 16/14; G11C 16/26; G06F 3/0604; G06F 9/3001; G06F 9/3893; G06F 3/0683; G06F 3/0629
USPC ...................................... 365/185.28, 185.18
See application file for complete search history.

(56) References Cited

U.S. PATENT DOCUMENTS

| | | | | |
|---|---|---|---|---|
| 5,818,761 | A * | 10/1998 | Onakado | G11C 16/0416 365/185.18 |
| 6,366,496 | B1 | 4/2002 | Torelli | |
| 6,522,584 | B1 | 2/2003 | Chen | |
| 7,088,623 | B2 * | 8/2006 | Huang | G11C 8/08 365/185.18 |
| 7,684,249 | B2 * | 3/2010 | Chen | G11C 11/5628 365/185.19 |
| 8,102,714 | B2 | 1/2012 | Chen | |
| 8,462,553 | B2 * | 6/2013 | Lee | G11C 16/10 365/185.2 |

* cited by examiner

*Primary Examiner* — Son L Mai
(74) *Attorney, Agent, or Firm* — Winston Hsu (57) ABSTRACT

A non-volatile memory cell includes a storage transistor having a first terminal, a second terminal, and a gate terminal. During a program operation, the first terminal of the storage transistor receives a data voltage according to a weighting to be stored in the non-volatile memory cell, the second terminal of the storage transistor is floating, and the gate terminal of the storage transistor is coupled to a program voltage. The program voltage is greater than the data voltage.

19 Claims, 4 Drawing Sheets

NON-VOLATILE MEMORY CELL COMPLIANT TO A NEAR MEMORY COMPUTATION SYSTEM

CROSS REFERENCE TO RELATED APPLICATIONS

This non-provisional application claims priorities of U.S. provisional application No. 62/781,605, filed on Dec. 19, 2018, and U.S. provisional application No. 62/872,715, filed on Jul. 11, 2019, included herein by reference in its entirety.

BACKGROUND OF THE INVENTION

1. Field of the Invention

The present invention is related to a non-volatile memory cell, and more particularly, to a non-volatile memory cell compliant to a near-memory computation system.

2. Description of the Prior Art

As artificial intelligence (AI) is applied to more and more fields, the demand for suitable computation hardware grows due to the bulk computations required by the algorithms of artificial intelligence. Generally, the AI system has to deal with lots of data in a short time to make predictions or judgments accurately, and the data computations are usually performed in parallel.

The neural network is one of the popular schemes for AI systems. The neural network includes lots of nodes. Each node will receive data from many other different nodes to perform the computation, and the computation result will be used by other nodes. Since the amount of data required for AI computation is very huge, the data is usually stored in the external memory, and will be retrieved to the internal memory by request. Therefore, the bandwidth for accessing data will affect the processing speed of the AI system, and the power consumption for accessing data also becomes a burden to the AI system.

SUMMARY OF THE INVENTION

One embodiment of the present invention discloses a non-volatile memory cell. The non-volatile memory cell includes a storage transistor having a first terminal, a second terminal, and a gate terminal.

During a program operation, the first terminal of the storage transistor receives an analog data voltage according to an analog weighting to be stored in the non-volatile memory cell, the second terminal of the storage transistor is floating, the gate terminal of the storage transistor is coupled to a program voltage, and the program voltage is greater than the data voltage.

Another embodiment of the present invention discloses a near-memory computation system. The near-memory computation system includes a plurality of computation nodes, and each of the computation nodes includes a plurality of non-volatile memory cells and a processing element.

Each of the non-volatile memory cells includes a storage transistor having a first terminal, a second terminal, and a gate terminal. The processing element is coupled to second terminals of storage transistors of the plurality of non-volatile memory cells. The processing element performs computation with data represented by weighting voltages outputted in parallel from the non-volatile memory cells.

During a program operation, the first terminals of the storage transistors receive data voltages according to weightings to be stored in the plurality of non-volatile memory cells, the second terminals of the storage transistors are floating, and the gate terminals of the storage transistors are coupled to a program voltage. The program voltage is greater than the data voltages.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
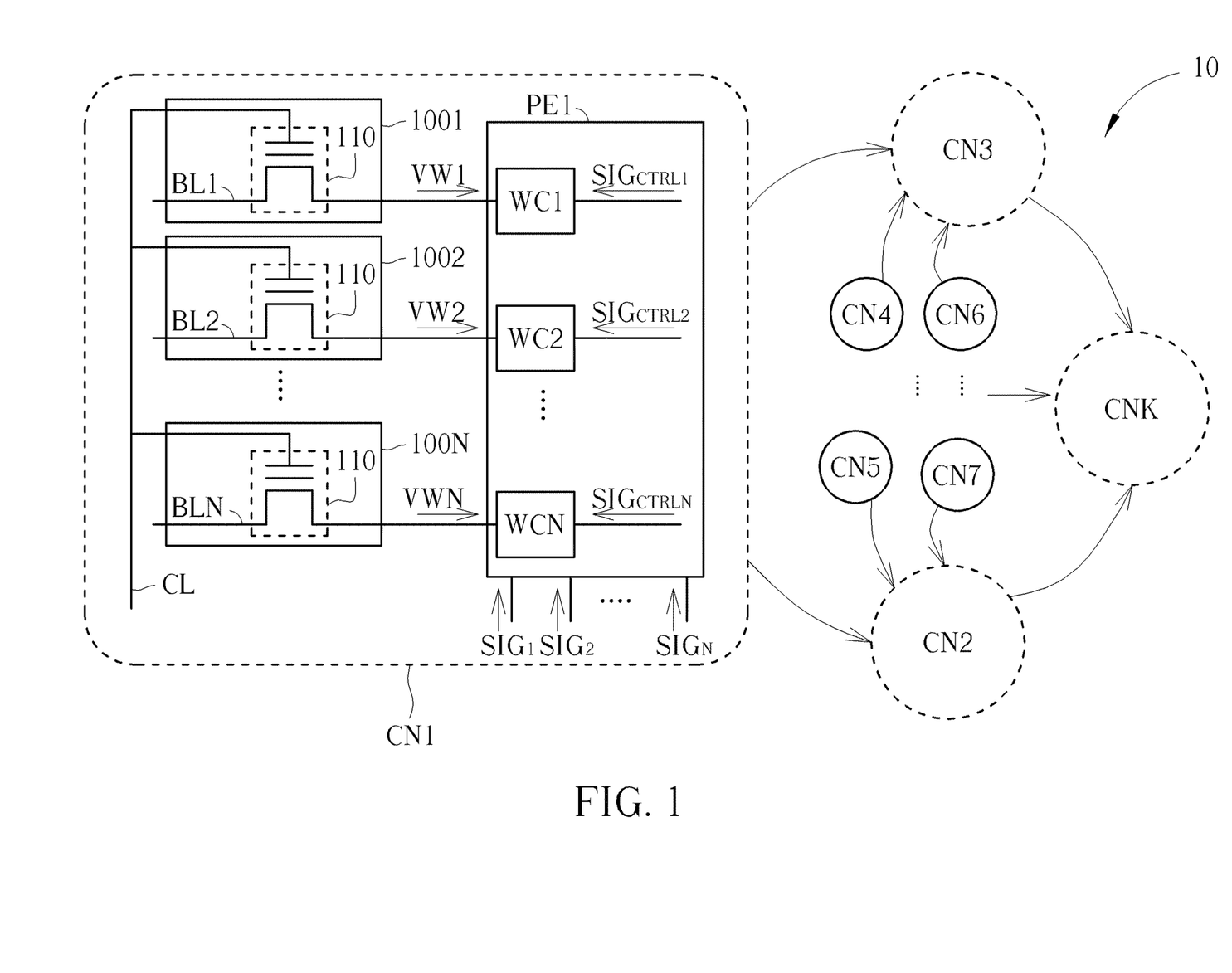
FIG. 1 shows a near-memory computation system according to one embodiment of the present invention.

FIG. 1 shows a near-memory computation system 10 according to one embodiment of the present invention. The near-memory computation system 10 includes a plurality of computation nodes CN1 to CNK, where K is an integer greater than 1. Each of the computation nodes CN1 to CNK can have the same structures. For example, the computation node CN1 can include a plurality of non-volatile memory cells 1001 to 100N, and a processing element PE1, where N is an integer greater than 1.

In some embodiments, each computation node CN1 to CNK can be used as a node in the neural network. For example, in FIG. 1, the processing element PE1 of the computation node CN1 can receive a plurality of input signals $SIG_1$ to $SIG_N$. For each input signal $SIG_1$ to $SIG_N$, the processing element PE1 can perform a computation with a corresponding weighting value, and the sum of the computation results can be outputted to another computation node as an input signal.

In this case, each of the non-volatile memory cells 1001 to 100N can store an analog weighting value and can output an analog weighting voltage VW1 to VWN according to the stored weighting value. Since the weighting voltages VW1 to VWN outputted by the non-volatile memory cells 1001 to 100N are analog and can be used as direct references of the weighting values, the computing burden of the processing element PE1 can be reduced.

In FIG. 1, the non-volatile memory cells 1001 to 100N can have the same structures. For example, the non-volatile memory cell 1001 can include a storage transistor 110 having a first terminal, a second terminal, and a gate terminal. In some embodiments, the storage transistors 110 can have a stack gate structure. For example, but not limited to, the gate of the storage transistors 110 can include a high-k dielectric layer. Also, each of the first terminals of the storage transistors 110 of the non-volatile memory cells 1001 to 100N can be coupled to a corresponding bit line of the bit lines BL1 to BLN, and the gate terminals of the storage transistors 110 of the non-volatile memory cells 1001 to 100N can be coupled to the same control line CL.

The processing element PE1 can be coupled to the second terminals of the storage transistors 110 of the non-volatile memory cells 1001 to 100N, and can perform computation with the weighting values represented by the weighting voltages VW1 to VWN outputted in parallel from the non-volatile memory cells 1001 to 100N.

In some embodiments, the non-volatile memory cells 1001 to 100N can be programmed by inducing Fowler-Nordheim tunneling (FN tunneling). For example, during the program operation, the first terminals of the storage transistors 110 of the non-volatile memory cells 1001 to 100N can receive data voltages through the bit lines BL1 to BLN according to the weighting values to be stored in the non-volatile memory cells 1001 to 100N, and the second terminals of the storage transistors 110 of the non-volatile memory cells 1001 to 100N can be floating. Also, the gate terminals of the storage transistors 110 of the non-volatile memory cells 1001 to 100N can be coupled to a program voltage VPP through the control line CL. In some embodiments, the program voltage VPP is greater than the data voltages. For example, the program voltage VPP can be 10V, and the data voltages can be 0V to 3V.

Figure 2:
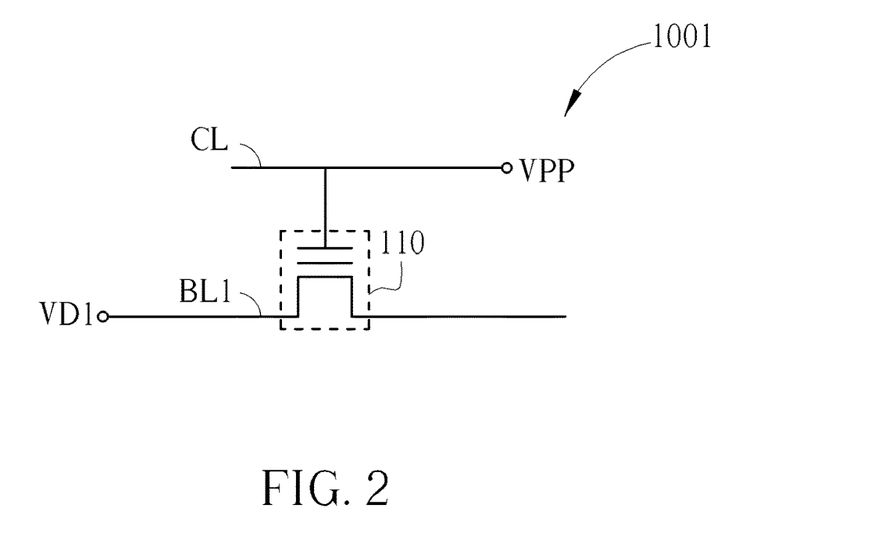
FIG. 2 shows the voltages received by the storage transistor of the non-volatile memory cell in FIG. 1 during the program operation.

For example, FIG. 2 shows the voltages received by the storage transistor 110 of the non-volatile memory cell 1001 during the program operation. In FIG. 2, the control line CL is at the program voltage VPP, and the bit line is at the data voltage VD1. In this case, if the data voltage VD1 is rather low, then the voltage difference between the gate terminal and the first terminal of the storage transistor 110 will be greater, thereby the gate structure of the storage transistor 110 will capture more electrons. However, if the data voltage VD1 is rather high, then the voltage difference between the gate terminal and the first terminal of the storage transistor 110 will be smaller, thereby the gate structure of the storage transistor 110 will capture fewer electrons. These electrons captured by the floating-gate of a storage transistor will build a non-volatile floating-gate potential so as to effectively alter the gate voltage of the storage transistor.

Consequently, according to the data voltages received by the storage transistors 110 of the non-volatile memory cells 1001 to 100N, the gate structures of the storage transistors 110 of the non-volatile memory cells 1001 to 100N may capture different amounts of electrons after the program operation. That is, the non-volatile memory cells 1001 to 100N may induce different degrees of FN tunneling, and the storage transistors 110 of the non-volatile memory cells 1001 to 100N may have different floating-gate potentials. Therefore, the storage transistors 110 of the non-volatile memory cells 1001 to 100N can have different program states, and the programming states can be used to represent the weighting values stored in the non-volatile memory cells 1001 to 100N.

In some embodiments, by providing suitable data voltages to the first terminals of the storage transistors 110 of the non-volatile memory cells 1001 to 100N through the bit lines BL1 to BLN, the storage transistors 110 of the non-volatile memory cells 1001 to 100N can have the targeted floating-gate potentials after the program operation. Consequently, the floating-gate potentials of the storage transistors 110 can be used to represent the weighting values of the non-volatile memory cells 1001 to 100N during the read operation. In some embodiments, the targeted floating-gate potentials of the storage transistors 110 of the non-volatile memory cells 1001 to 100N can be designed to be in the range of 0V to 3V according to the weighting values to be stored in the non-volatile memory cells 1001 to 100N. For example, to represent 3 bits of weighting values, the targeted floating-gate potentials can be 0.3V, 0.6V, 0.9V, 1.2V, 1.5V, 1.8V, 2.1V, and 2.4V.

Figure 3:
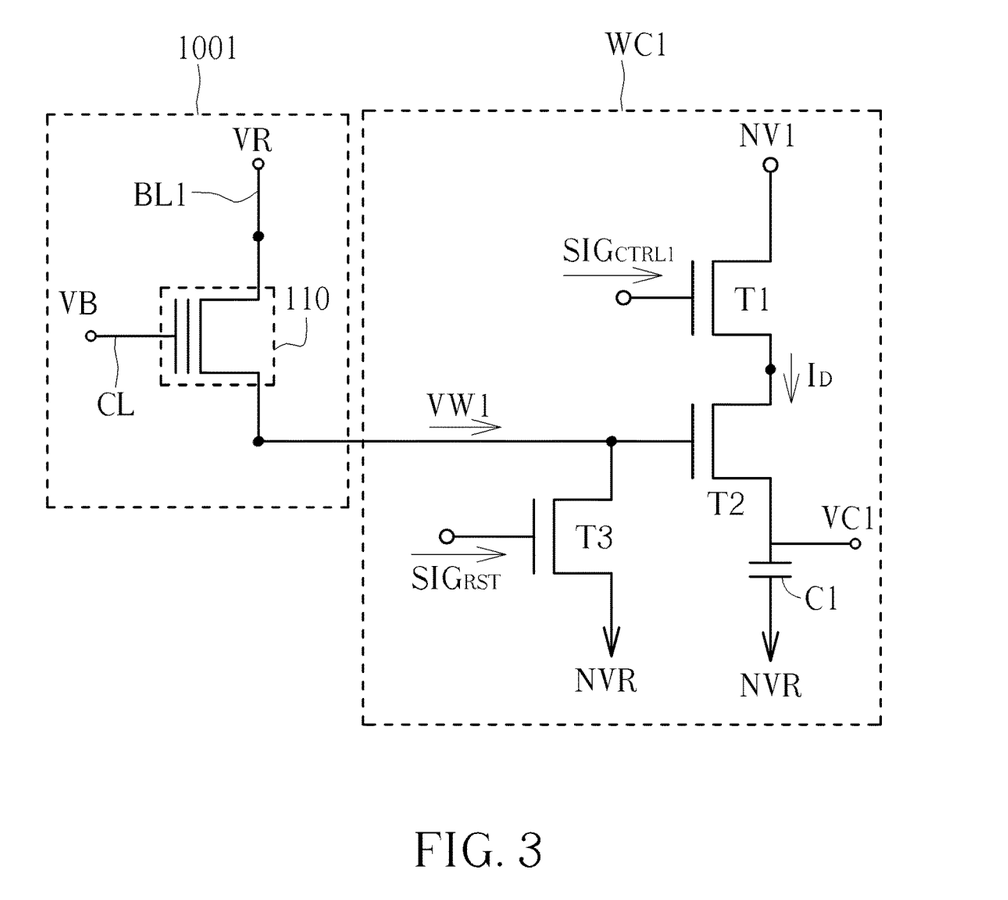
FIG. 3 shows the voltages received by the storage transistor of the non-volatile memory cell in FIG. 1 during the read operation.

FIG. 3 shows the voltages received by the storage transistor 110 of the non-volatile memory cell 1001 during the read operation. During the read operation, the first terminal of the storage transistor 110 of the non-volatile memory cell 1001 can receive a read voltage VR, and the gate terminal of the storage transistor 110 of the non-volatile memory cell 1001 can be coupled to a bias voltage VB. In some embodiments, the program voltage VPP can be greater than the read voltage VR, and the read voltage VR can be greater than the highest floating-gate potential. For example, in the present embodiment, the read voltage VR can be 3V.

Since the read voltage VR is greater than the floating-gate potential of the storage transistor 110 of the non-volatile memory cell 1001, the second terminal of the storage transistor 110 of the non-volatile memory cell 1001 would be at a voltage lower than the floating gate potential of the storage transistor 110 by the threshold voltage of the storage transistor 110 during the read operation.

For example, if the floating-gate potential and the threshold voltage of the storage transistor 110 of the non-volatile memory cell 1001 are 2V and 0.3V respectively, then the second terminal of the storage transistor 110 of the non-volatile memory cell 1001 would be at 1.7V. Also, if the floating-gate potential and the threshold voltage of the storage transistor 110 of the non-volatile memory cell 1001 are 1V and 0.3V respectively, then the second terminal of the storage transistor 110 of the non-volatile memory cell 1001 would be at 0.7V. Therefore, the weighting voltage VW1 can be generated according to the floating-gate potential set by the program operation.

Furthermore, in some embodiments, the storage transistors 110 of the non-volatile memory cells 1001 to 100N can receive the same voltages to perform the read operation simultaneously. In this case, the second terminals of the storage transistors 110 of the non-volatile memory cells 1001 to 100N can output the weighting voltages VW1 to VWN according to the floating-gate potentials of the storage transistors 110 of the non-volatile memory cells 1001 to 100N in parallel.

Furthermore, in some embodiments, the bias voltage can be 0V. However, to comply with the processing element PE, the base voltage of the weighting voltages VW1 to VWN outputted by the non-volatile memory cells 1001 to 100N can be adjusted by shifting the bias voltage. For example, if the bias voltage is adjusted to 1V, then the weighting voltages VW1 to VWN outputted by the non-volatile memory cells 1001 to 100N will all be raised by 0.9V if the bias voltage has a coupling ratio of 90% to a floating-gate. In some embodiments, the read voltage should be greater than the bias voltage so the non-volatile memory cells 1001 to 100N can output the weighting voltages VW1 to VWN according to floating-gate potentials properly.

In some embodiments, the processing element PE1 can include a plurality of weighting circuits WC1 to WCN coupled to the non-volatile memory cells 1001 to 110N respectively. Each of the weighting circuits WC1 to WCN can receive a weighting voltage from the corresponding non-volatile memory cell and a control signal. The weighting circuits WC1 to WCN can perform computations according to the control signals $SIG_{CTRL1}$ to $SIG_{CTRLN}$ and the weighting voltages VW1 to VWN. In some embodiments, the computations performed by the weighting circuits WC1 to WCN can be multiplication.

FIG. 3 shows a non-volatile memory cell 1001 and a weighting circuit WC1 of the processing element PE1 according to one embodiment of the present invention.

The weighting circuit WC1 includes a control transistor T1, a weighting transistor T2, a reset transistor T3, and a capacitor C1. The control transistor T1 has a first terminal coupled to a system voltage terminal NV1, a second terminal, and a control terminal for receiving the control signal $SIG_{CTRL1}$. The weighting transistor T2 has a first terminal coupled to the second terminal of the control transistor T1, a second terminal, and a control terminal coupled to a first terminal of the storage transistor 110 of the non-volatile memory cell 1001 for receiving the corresponding weighting voltage VW1. The reset transistor T3 has a first terminal coupled to the control terminal of the weighting transistor T2, a second terminal coupled to a reference voltage terminal NVR, and a control terminal for receiving a reset signal $SIG_{RST}$. The capacitor C1 has a first terminal coupled to the second terminal of the weighting transistor T2 for outputting a computing voltage VC1, and a second terminal coupled to the reference voltage terminal NVR.

In some embodiments, before the weighting circuit WC1 starts the computation, the reset transistor T3 can be turned on by the reset signal $SIG_{RST}$ for a period of time so as to discharge the second terminal of the storage transistor 110. Afterwards, the reset signal $SIG_{RST}$ can turn off the reset transistor T3 so that the second terminal of the storage transistor 110 could be charged according to its floating-gate potential by the current flowing through the storage transistor. During the computation of the weighting circuit WC1, the control terminal of the control transistor T1 will receive the control signal $SIG_{CTRL1}$, the control terminal of the weighting transistor T2 will receive the weighting voltage VW1, and the capacitor C1 can be charged by the current $I_D$ generated by the control transistor T1 and the weighting transistor T2.

In some embodiments, the control signal $SIG_{CTRL1}$ is a pulse signal having a fixed voltage with a pulse width determined by the input signal $SIG_1$. For example, if the value represented by the input signal $SIG_1$ is larger, then the pulse of the control signal $SIG_{CTRL1}$ will last longer. If the value represented by the input signal $SIG_1$ is smaller, then the pulse of the control signal $SIG_{CTRL1}$ will last shorter. That is, the control signal $SIG_{CTRL}$ can be used to control the length of the turn-on period of the control transistor T1.

Also, the weighting voltage VW1 can control the rating of the current $I_D$ generated by the weighting transistor T2. For example, if the weighting voltage VW1 is greater, then the current $I_D$ will be greater. If the weighting voltage VW1 is smaller, then the current $I_D$ will be smaller. Therefore, the voltage at the first terminal of the capacitor C1 will be related to the product of the weighting value stored in the non-volatile memory cell 1001 and the value represented by the input signal $SIG_1$.

Since the non-volatile memory cells 1001 to 100N can output analog weighting voltages VW1 to VWN to represent the weighting values, and the processing element PE1 can use the analog weighting voltages VW1 to VWN for computation directly, the computation effort of the processing element PE1 can be significantly reduced. Also, in some embodiments, although the non-volatile memory cells 1001 to 100N can be formed in one chip while the processing element PE1 is formed in another chip, the processing element PE1 can be coupled to the non-volatile memory cells 1001 to 100N directly, thereby greatly reducing the time for memory access.

In FIG. 1, each of the non-volatile memory cells 1001 to 100N can be implemented with one storage transistor 110. However, in some embodiments, the non-volatile memory cells may be implemented with more transistors.

Figure 4:
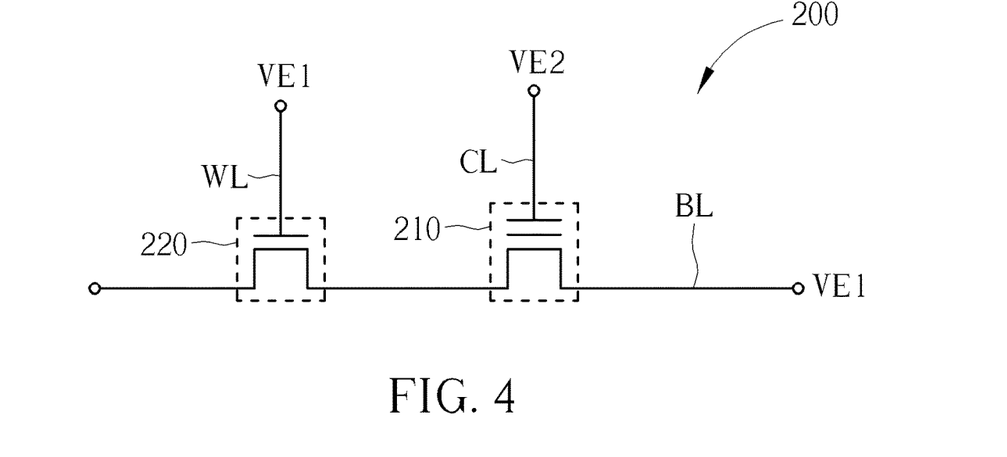
FIG. 4 shows a non-volatile memory cell according to another embodiment of the present invention.

FIG. 4 shows a non-volatile memory cell 200 according to another embodiment of the present invention. The non-volatile memory cells 100 and 200 have similar structures and can be operated with similar principles. The non-volatile memory cell 200 can be adopted by the near-memory computation system 10 in some embodiments. The non-volatile memory cell 200 includes a storage transistor 210 and a select transistor 220.

The select transistor 220 has a first terminal coupled to the second terminal of the storage transistor 210, a second terminal, and a control terminal coupled to a word line WL. Also, the first terminal of the storage transistor 210 can be coupled to the bit line BL. In some embodiments, the select transistor 220 can be controlled by the word line WL, and the non-volatile memory cell 200 can output the weighting voltage through the second terminal of the select transistor 220. In this case, non-volatile memory cells 200 coupled to different processing elements can output the weighting voltages at different periods of time, allowing non-volatile memory cells 200 coupled to different processing elements to be disposed in the same memory array and share the same bit line, thereby improving the design flexibly.

However, in some embodiments, the non-volatile memory cell 200 can still output the weighting voltage through the second terminal of the storage transistor 210. That is, the non-volatile memory cell 200 can be coupled to the processing element through the second terminal of the storage transistor 210 or the second terminal of the select transistor 220 according to the system requirements.

Also, the program operation of the non-volatile memory cell 200 can be performed with the same voltages used in FIG. 2. However, the word line WL can be at a reference voltage VR smaller than the program voltage, so the select transistor 220 can be turned off, and the second terminal of the storage transistor 210 can be floating.

In some embodiments, the non-volatile memory cell 200 can be erased so as to store a new weighting value afterwards. FIG. 4 further shows the voltages received by the non-volatile memory cell 200 during an erase operation. During the erase operation, the word line WL and the bit line BL can be at a first erase voltage VE1, and the control line CL can be at a second erase voltage VE2. Furthermore, in some embodiments, the storage transistor 210 and the select transistor 220 are disposed in a P-well within a deep N-well. In this case, the deep N-well and P-well can both be at the first erase voltage VE1 during the erase operation.

In some embodiments, the program voltage VPP can be greater than the first erase voltage VE1, the first erase voltage VE1 can be greater than the reference voltage, and the reference voltage can be greater than the second erase voltage VE2. For example, the program voltage VPP can be 10V, the first erase voltage VE1 can be 5V, the reference voltage can be 0V, and the second erase voltage can be −5V. In this case, during the erase operation, electrons captured by the storage transistor 210 will be ejected from the gate structure, and the program state of the storage transistor 210 can be recovered.

Figure 5:
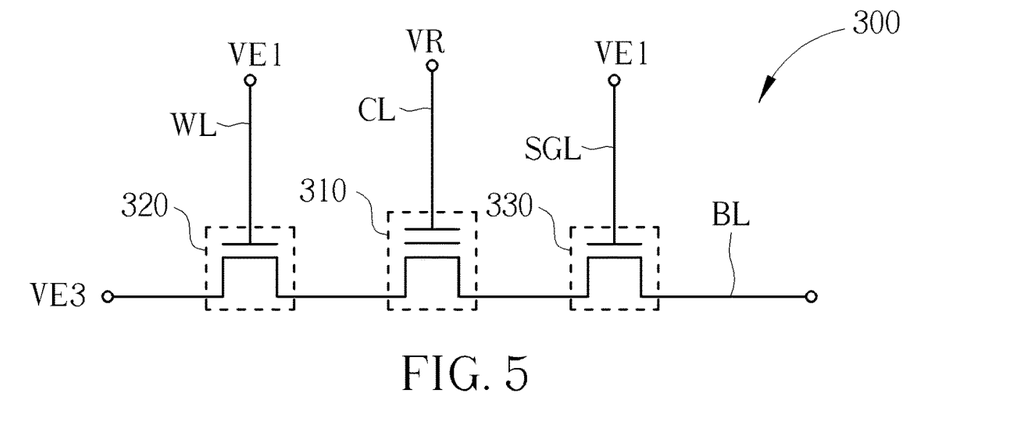
FIG. 5 shows a non-volatile memory cell according to another embodiment of the present invention.

FIG. 5 shows a non-volatile memory cell 300 according to another embodiment of the present invention. The non-volatile memory cells 200 and 300 have similar structures and can be operated with similar principles. In some embodiments, the non-volatile memory cell 200 can be adopted by the near-memory computation system 10. The non-volatile memory cell 300 includes a storage transistor 310, a first select transistor 320, and a second select transistor 330. The second select transistor 330 has a first terminal coupled to the first terminal of the storage transistor 310, a second terminal coupled to the bit line BL, and a control terminal coupled to a select gate line SGL.

In some embodiments, the program operation of the non-volatile memory cell 300 can be performed with the same voltages used in FIG. 2 with the word line WL being at the reference voltage VR smaller than the program voltage. That is, the first select transistor 320 can be turned off, and the second terminal of the storage transistor 210 can be floating. Also, the select gate line SGL can be at an operation voltage greater than the data voltage on the bit line BL so the second select transistor 330 can be turned on during the program operation.

FIG. 5 further shows the voltages received by the non-volatile memory cell 300 during the erase operation. During the erase operation, the word line WL and the select gate line SGL can be at the first erase voltage VE1, and the control line CL can be at the reference voltage VR. Also, the second terminal of the first select transistor 320, the deep N-well and the P-well of the storage transistor 310 can be at a third erase voltage VE3, and the bit line BL can be floating. In this case, the third erase voltage VE3 can be greater than the first erase voltage VE1, and the first erase voltage VE1 can be greater than the reference voltage VR. For example, the third erase voltage VE3 can be 10V, the first erase voltage VE1 can be 5V, and the reference voltage VR can be 0V. In this case, the high voltage applied on the body of the storage transistor 310 can cause the electrons ejecting from the gate structure of the storage transistor 310, recovering the program state of the storage transistor 310.

Figure 6:
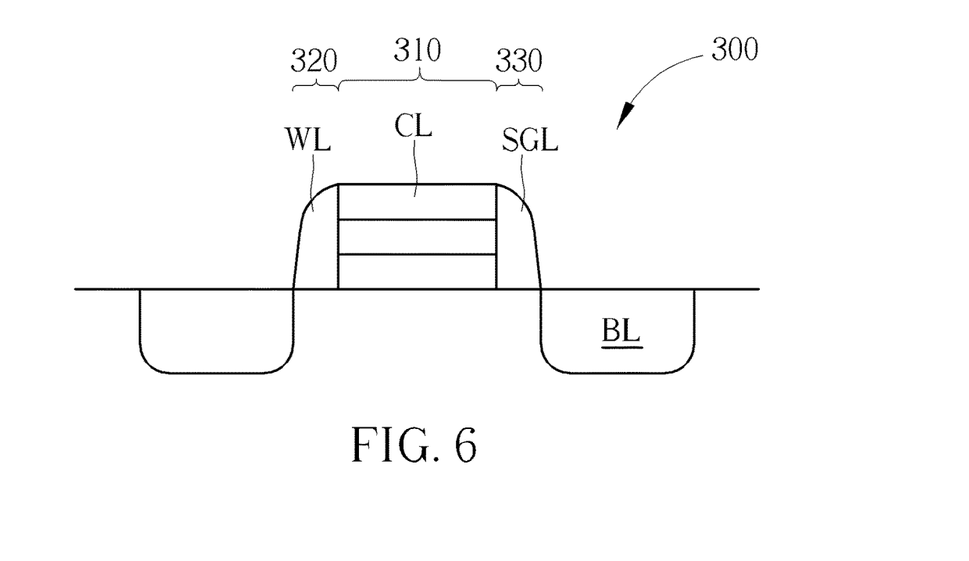
FIG. 6 shows the non-volatile memory cell in FIG. 5 implemented by the split gate structure.

In some embodiments, since the non-volatile memory cell 300 has a symmetrical structure, the first select transistor 320, the storage transistor 310, and the second select transistor 330 can be formed by a split gate structure to save the circuit area. FIG. 6 shows the non-volatile memory cell 300 implemented by the split gate structure. In FIG. 6, the first selection transistor 320 and the second selection transistor 330 can be formed by the sidewall of the stack gate of the storage transistor 310; therefore, the area of the non-volatile memory cell can be significantly reduced.

Figure 7:
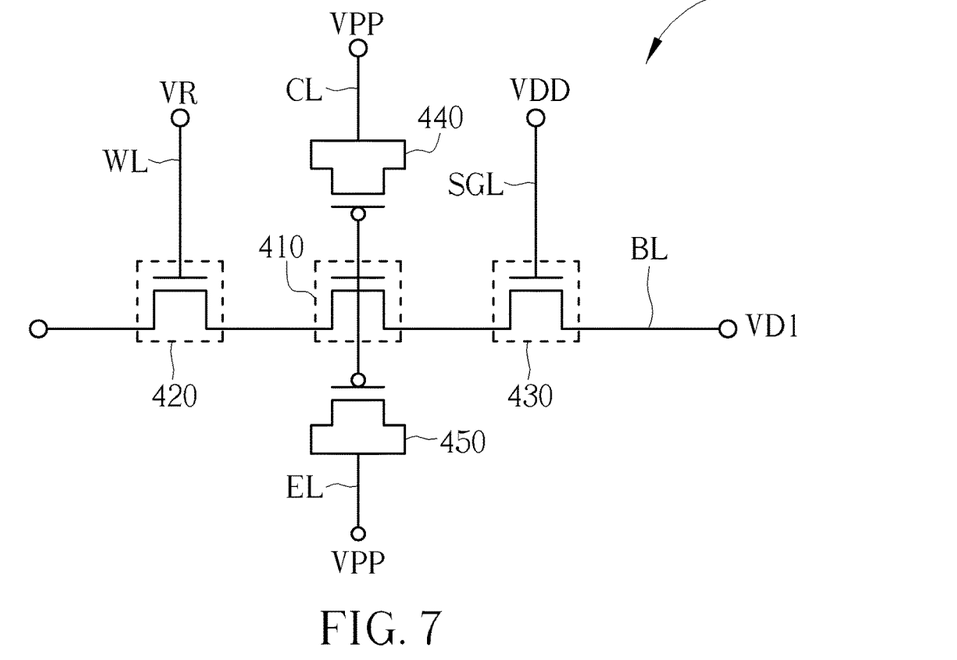
FIG. 7 shows a non-volatile memory cell according to another embodiment of the present invention.

FIG. 7 shows a non-volatile memory cell 400 according to another embodiment of the present invention. The non-volatile memory cells 300 and 400 have similar structures and can be operated with similar principles. However, the non-volatile memory cell 400 includes a storage transistor 410, a first select transistor 420, and a second select transistor 430.

In FIG. 7, the storage transistor 410 has a floating gate structure. In this case, the non-volatile memory cell 400 can further include a control element 440 and an erase element 450 for controlling the gate terminal of the storage transistor 410. The control element 440 has a first terminal coupled to the gate terminal of the storage transistor 410, and a second terminal coupled to the control line CL. The erase element 450 has a first terminal coupled to the gate terminal of the storage transistor 410, and a second terminal coupled to an erase line EL.

In FIG. 7, the control element 440 and the erase element 450 can be capacitors implemented by transistors. In this case, the first terminal of the control element 440 and the first terminal of the erase element 450 can be the polysilicon layer, and the polysilicon layer of can be extended to the gate terminal of the storage transistor 410. That is, the gate terminal of the storage transistor 410 and the first terminals of the control element 440 and the erase elements 450 can be coupled together through the same polysilicon layer. Also, the second terminals of the control element 440 and the erase elements 450 can be the source/drain terminals of the transistors.

In some embodiments, the coupling area of the control element 440 can be designed to be much greater than the coupling area of the floating gate of the storage transistor 410. Therefore, by applying a target voltage to the control line CL, the gate terminal of the storage transistor 410 would be coupled to a voltage close to the target voltage. Therefore, the control element 440 can be used to perform the program operation for inducing FN tunneling on the floating gate of the storage transistor 410.

However, the coupling area of the erase element 450 can be designed to be much smaller than the coupling area of the floating gate of the storage transistor 410. In this case, the voltage applied to the erase line EL may not be coupled to the gate terminal of the storage transistor 410; therefore, the erase line EL can be used to perform the erase operation.

FIG. 7 also shows the voltages received by the non-volatile memory cell 400 during the program operation. In FIG. 7, during the program operation, the word line WL is at the reference voltage VR, and the first select transistor 420 is turned off. The select gate line SGL is at an operation voltage VDD, and the second select transistor 430 is turned on. The control line CL and the erase line EL are at the program voltage VPP, and the bit line BL is at the data voltage VD1. In some embodiments, the program voltage VPP can be greater than the operation voltage VDD, and the operation voltage VDD can be greater than the reference voltage VR. For example, the program voltage VPP can be 10V, the operation voltage VDD can be 3V, and the reference voltage VR can be 0V.

In this case, the gate terminal of the storage transistor 410 can be coupled to the program voltage VPP through the control element 440, and the first terminal of the storage transistor 410 can receive the data voltage VD1 through the second select transistor 430. Therefore, the voltage applied to the storage transistor 410 may induce the FN tunneling and change the program state of the storage transistor 410.

Figure 8:
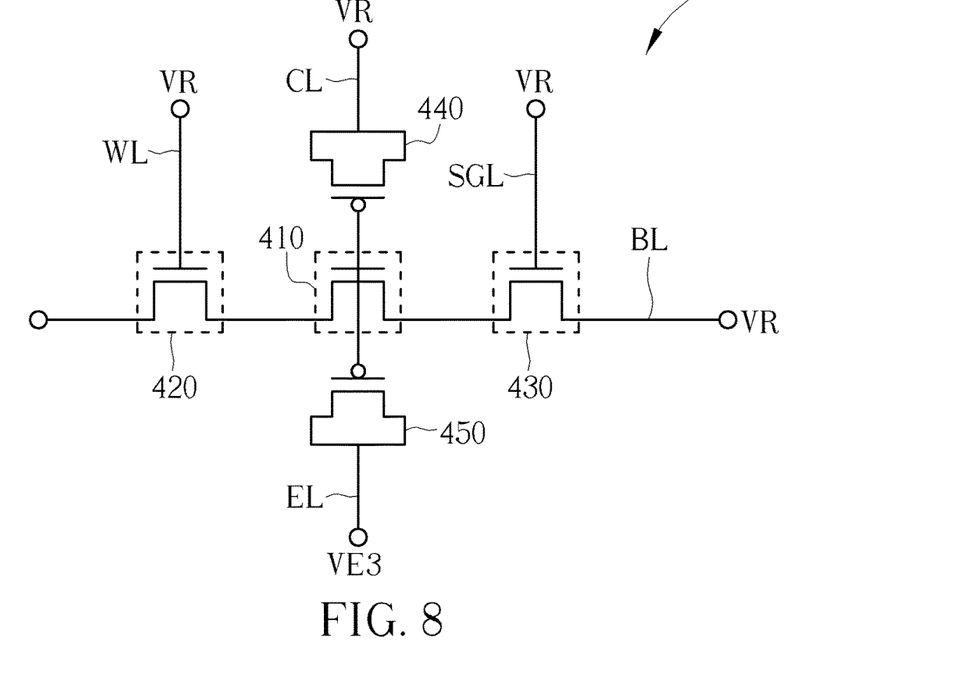
FIG. 8 shows the voltages received by the non-volatile memory cell in FIG. 7 during the erase operation.

FIG. 8 shows the voltages received by the non-volatile memory cell 400 during the erase operation. In FIG. 8, during the erase operation, the word line WL, the select gate line SGL, and the bit line BL are at the reference voltage VR so the first select transistor 420 and the second select transistor 430 can be turned off. The control line CL is also at the reference voltage VR, and the erase line EL can be at the third erase voltage VE3. In this case, the electrons captured by the floating gate of the storage transistor 410 would be ejected through the erase element 450 due to the high erase voltage VE3.

Consequently, the non-volatile memory cell 400 can be programmed to store different weighting values and output the analog weighting voltages for the processing elements when adopted by the near-memory computation system 10 in some embodiments.

In summary, the non-volatile memory cell provided by the embodiments of the present invention can output analog weighting voltages to represent the weighting values, and the processing element of the near-memory computing system can use the analog weighting voltages for computation directly. Therefore, the computation effort and the time for memory access for the near-memory computing system can be significantly reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile memory cell comprising:
   a storage transistor having a first terminal, a second terminal, and a gate terminal;
   wherein during a program operation:
   the first terminal of the storage transistor receives a data voltage according to a weighting to be stored in the non-volatile memory cell;
   the second terminal of the storage transistor is floating;
   the gate terminal of the storage transistor is coupled to a program voltage; and
   the program voltage is greater than the data voltage;
   wherein during a read operation:
   the first terminal of the storage transistor receives a read voltage;
   the gate terminal of the storage transistor is coupled to a bias voltage; and
   the second terminal of the storage transistor outputs a weighting voltage;
   wherein the program voltage is greater than the read voltage, and the read voltage is greater than the bias voltage.

2. The non-volatile memory cell of claim 1, wherein:
   the storage transistor has a stack gate structure, and the gate terminal of the storage transistor is coupled to a control line.

3. The non-volatile memory cell of claim 2, further comprising:
   a first select transistor having a first terminal coupled to the second terminal of the storage transistor, a second terminal, and a control terminal coupled to a word line;
   wherein during the program operation, the word line is at a reference voltage smaller than the program voltage, and the first select transistor is turned off.

4. The non-volatile memory cell of claim 3, wherein the first terminal of the storage transistor is coupled to a bit line.

5. The non-volatile memory cell of claim 4, wherein:
   the storage transistor and the first select transistor are disposed in a P-well within a deep N-well;
   during an erase operation:
   the word line, the bit line, the deep N-well, and the P-well are at a first erase voltage; and
   the control line is at a second erase voltage;
   wherein the program voltage is greater than the first erase voltage, the first erase voltage is greater than the reference voltage, and the reference voltage is greater than the second erase voltage.

6. A near-memory computation system comprising:
   a plurality of computation nodes, each comprising:
      a plurality of non-volatile memory cells, each comprising a storage transistor having a first terminal, a second terminal, and a gate terminal; and
      a processing element coupled to second terminals of storage transistors of the plurality of non-volatile memory cells, and configured to perform computation with data represented by weighting voltages outputted in parallel from the non-volatile memory cells;
   wherein during a program operation:
   first terminals of the storage transistors receive data voltages according to weightings to be stored in the plurality of non-volatile memory cells;
   the second terminals of the storage transistors are floating; and
   gate terminals of the storage transistors are coupled to a program voltage;
   wherein the program voltage is greater than the data voltages.

7. The near-memory computation system of claim 6, wherein during a read operation:
   the first terminals of the storage transistors receive a read voltage;
   the gate terminals of the storage transistors are coupled to a bias voltage; and
   the second terminals of the storage transistors output the weighting voltages;
   wherein the program voltage is greater than the read voltage, and the read voltage is greater than the bias voltage.

8. The near-memory computation system of claim 6, wherein:
   each of the storage transistors has a stack gate structure, and the gate terminals of the storage transistors are coupled to a control line.

9. The near-memory computation system of claim 8, wherein each of the plurality of non-volatile memory cells further comprises:
   a first select transistor having a first terminal coupled to the second terminal of the storage transistor, a second terminal, and a control terminal coupled to a word line;
   wherein during the program operation, the word line is at a reference voltage smaller than the program voltage, and the first select transistor is turned off.

10. The near-memory computation system of claim 9, wherein each of the first terminals of the storage transistors is coupled to a bit line.

11. The near-memory computation system of claim 10, wherein:
   the storage transistor and the first select transistor are disposed in a P-well within a deep N-well;
   during an erase operation:
   the word line, the bit line, the deep N-well, and the P-well are at a first erase voltage; and
   the control line is at a second erase voltage;
   wherein the program voltage is greater than the first erase voltage, the first erase voltage is greater than the reference voltage, and the reference voltage is greater than the second erase voltage.

12. The near-memory computation system of claim 9, wherein each of the plurality of non-volatile memory cells further comprises:
   a second select transistor having a first terminal coupled to the first terminal of the storage transistor, a second terminal coupled to a bit line, and a control terminal coupled to a select gate line;
   wherein during the program operation, the select gate line is at an operation voltage greater than the data voltage, and the second select transistor is turned on during the program operation.

13. The near-memory computation system of claim 12, wherein:

the storage transistor, the first select transistor and the second select transistor are disposed in a P-well within a deep N-well;

during an erase operation:
the word line and the select gate line are at a first erase voltage;
the control line is at the reference voltage;
the second terminal of the first select transistor, the deep N-well and the P-well are at a third erase voltage; and
the bit line is floating;
wherein the third erase voltage is greater than the first erase voltage, and the first erase voltage is greater than the reference voltage.

14. The near-memory computation system of claim 12, wherein the first select transistor, the storage transistor, and the second select transistor of the storage memory cell are formed with a split gate structure.

15. The near-memory computation system of claim 6, wherein:
the storage transistor has a floating gate structure;
each of the plurality of non-volatile memory cells further comprises:
a control element having a first terminal coupled to the gate terminal of the storage transistor, and a second terminal coupled to a control line; and
an erase element having a first terminal coupled to the gate terminal of the storage transistor, and a second terminal coupled to an erase line.

16. The near-memory computation system of claim 15, wherein each of the plurality of non-volatile memory cells further comprises:
a first select transistor having a first terminal coupled to the second terminal of the storage transistor, a second terminal, and a control terminal coupled to a word line; and
a second select transistor having a first terminal coupled to the first terminal of the storage transistor, a second terminal coupled to a bit line, and a control terminal coupled to a select gate line;
wherein during the program operation:
the word line is at a reference voltage, and the first select transistor is turned off;
the select gate line is at an operation voltage, and the second select transistor is turned on;
the control line and the erase line are at the program voltage; and
the bit line is at the data voltage;
wherein the program voltage is greater than the operation voltage, and the operation voltage is greater than the reference voltage.

17. The near-memory computation system of claim 16, wherein during an erase operation:
the word line, the select gate line, the bit line and the control line are at the reference voltage;
the first select transistor and the second select transistor are turned off; and
the erase line is at a third erase voltage;

wherein the third erase voltage is greater than the operation voltage.

18. The near-memory computation system of claim 6, wherein the processing element comprises a plurality of weighting circuits coupled to the plurality of non-volatile memory cells, each comprising:
a control transistor having a first terminal coupled to a system voltage terminal, a second terminal, and a control terminal configured to receive a control signal;
a weighting transistor having a first terminal coupled to the second terminal of the control transistor, a second terminal, and a control terminal coupled to a first terminal of a storage transistor of a corresponding non-volatile memory cell for receiving a corresponding weighting voltage;
a reset transistor having a first terminal coupled to the control terminal of the weighting transistor, a second terminal coupled to a reference voltage terminal, and a control terminal configured to receive a reset signal; and
a capacitor having a first terminal coupled to the second terminal of the weighting transistor for outputting a computing voltage, and a second terminal coupled to the reference voltage terminal.

19. A non-volatile memory cell comprising:
a storage transistor having a stack gate structure, and comprising a first terminal coupled to a bit line, a second terminal, and a gate terminal coupled to a control line; and
a first select transistor having a first terminal coupled to the second terminal of the storage transistor, a second terminal, and a control terminal coupled to a word line;
wherein the storage transistor and the first select transistor are disposed in a P-well within a deep N-well;
wherein during a program operation:
the first terminal of the storage transistor receives a data voltage according to a weighting to be stored in the non-volatile memory cell;
the second terminal of the storage transistor is floating;
the gate terminal of the storage transistor is coupled to a program voltage;
the program voltage is greater than the data voltage; and
the word line is at a reference voltage smaller than the program voltage, and the first select transistor is turned off;
wherein during an erase operation:
the word line, the bit line, the deep N-well, and the P-well are at a first erase voltage; and
the control line is at a second erase voltage;
wherein the program voltage is greater than the first erase voltage, the first erase voltage is greater than the reference voltage, and the reference voltage is greater than the second erase voltage.

* * * * *